US007620090B2

United States Patent
Ueda et al.

(10) Patent No.: US 7,620,090 B2
(45) Date of Patent: Nov. 17, 2009

(54) SEMICONDUCTOR LASER DEVICE

(75) Inventors: Takashi Ueda, Tokyo (JP); Koji Yamada, Tokyo (JP); Tomoki Nozawa, Tokyo (JP); Yoshihiko Kobayashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/769,818

(22) Filed: Jun. 28, 2007

(65) Prior Publication Data

US 2008/0008221 A1  Jan. 10, 2008

(30) Foreign Application Priority Data

Jun. 30, 2006  (JP) .............................. 2006-180978

(51) Int. Cl.
*H01S 5/00* (2006.01)

(52) U.S. Cl. ................. 372/50.21; 372/49.01; 372/50.1

(58) Field of Classification Search .............. 372/50.21, 372/49.01, 50.1
See application file for complete search history.

(56) References Cited

U.S. PATENT DOCUMENTS 5,184,247 A * 2/1993 Schimpe .................... 359/344
5,835,514 A * 11/1998 Yuen et al. .................. 372/36
6,813,102 B2 11/2004 Furuichi et al.
6,856,637 B2 * 2/2005 Tsumori et al. .......... 372/50.21

FOREIGN PATENT DOCUMENTS

| JP | 6-289258 | 10/1994 |
| JP | 9-270566 | 10/1997 |
| JP | 2003303975 | 10/2003 |

* cited by examiner

*Primary Examiner*—Minsun Harvey
*Assistant Examiner*—Yuanda Zhang
(74) *Attorney, Agent, or Firm*—Volentine & Whitt, P.L.L.C.

(57) ABSTRACT

A semiconductor laser device includes a supporting substrate having a wiring pattern thereon; LD fixed on the surface of the supporting substrate and having a signal output section that emits signal laser light and a monitoring output section that emits monitoring laser light; and a monitoring PD. The monitoring PD includes a semiconductor substrate having a region that transmits light of the wavelength of the monitoring laser light; and a light receiving section for photoelectric conversion formed on the surface of the semiconductor substrate, one incident surface of the side surfaces of the semiconductor substrate arranged in a position to which the monitoring laser light can be made incident, the light receiving section arranged in a position higher than the monitoring output section, and a back surface of the semiconductor substrate and the wiring pattern fixed on the supporting substrate to oppose each other.

14 Claims, 9 Drawing Sheets

SEMICONDUCTOR LASER DEVICE

CROSS REFERENCE TO RELATED APPLICATION

This application claims the priority of Application. No. 2006-180978, filed Jun. 30, 2006 in Japan, the subject matter of which is incorporated herein by reference.

BACKGROUND OF THE INVENTION

1. Technical Field of the Invention

The present invention relates to a semiconductor laser device, being a semiconductor laser module having a semiconductor laser element (hereinafter, referred to as "LD"), and a photodiode (hereinafter, referred to as "PD") for monitoring the light power of the LD, and relates in particular to an arrangement and a structure of a PD for a monitor (hereinafter, referred to as "monitor PD").

2. Description of the Background Art

Semiconductor laser devices mainly used in optical communication, for example, as disclosed in the following Patent Documents 1, 2, and 3, are often provided with a mechanism to monitor the optical power of a LD in order to stabilize the optical power of the light output of the LD. In this case, the forward optical output of the LD is generally used for an optical signal, while the rearward optical output is received by a monitor PD to control the driving electric current of the LD so that the forward optical power becomes constant.

[Patent Document 1] Japanese Unexamined Patent Publication No. Hei 6-289258

[Patent Document 2] Japanese Unexamined Patent Publication No. 2003-303975

[Patent Document 3] Japanese Unexamined Patent Publication No. Hei 9-270566

In general, as an installation method of the monitor PD, as described in Patent Document 1, the monitor PD is mounted on a subcarrier for a PD. The LD is mounted on a subcarrier for a LD. On a laser carrier, the subcarrier for a PD is arranged behind the subcarrier for a LD. These subcarriers are fixed on the laser carrier. The subcarrier is a supporting base and is sometimes called a submount, a base, or a header.

However, in the above installation method, the number of parts increases, leading to a problem of an increase in the number of assembly processes. An even larger problem is that the size of the subcarrier for the PD is significantly greater than that of the LD.

Recently, in a semiconductor laser device of a shape in which the direction of the optical output and the direction of a pin for extracting electric signals (leading terminal) oppose each other, a signal line for the LD, which drives the LD, needs to be arranged so as to avoid the subcarrier for a monitor PD. In the case where the frequency for driving the LD is, for example, 2.5 GHz or less, avoiding this signal line for the LD is not a significant problem. However, in the case where the frequency for driving the LD is 10 GHz or more, the wiring pattern of the signal line for the LD exerts a significant influence on the transmission of electric signals, and if the signal line is arranged so as to avoid a large-sized subcarrier for the monitor, the frequency characteristics of the semiconductor laser device are significantly impaired.

As a means to solve this problem, as described in Patent Documents 2 and 3, there is a method of directly installing the monitor PD rearward of the LD without using the subcarrier for the monitor PD.

In Patent Document 2, a LD is fixed on a silicon (Si) substrate, and a PD is fixed within a trench (concave section) formed on the Si substrate to the rear of this LD. A light receiving section of this PD is arranged in a position lower than the LD.

In Patent Document 3, a PD is formed on a surface of a semiconductor substrate, and a LD is fixed on the semiconductor substrate so as to be adjacent to and higher than this PD. Then, a prism for light-focusing is provided above the light receiving section of the PD, and the optical output from the rearward of the LD is incident on the light receiving section of the PD via the prism.

However, in any one of the methods disclosed in Patent Documents 2 and 3, processing needs to be performed on the substrate on which the LD is mounted. Moreover, in order to obtain a stable monitor PD electric current, high precision installation of the monitor PD is required. As a result, there has been a problem of an increase in the number of manufacturing processes and a resultant high manufacturing cost.

BRIEF SUMMARY OF THE INVENTION

A first object of the present invention is to provide a semiconductor laser device able to carry out signal transmission when operating at a high speed of 10 GHz or greater, without any impairment to the frequency characteristics thereof.

A second object of the present invention is to provide a semiconductor laser device having a structure with a supporting substrate that can be inexpensively manufactured.

A third object of the present invention is to provide a semiconductor laser device able to efficiently convert monitoring laser light into a monitoring signal.

A fourth object of the present invention is to provide a semiconductor laser device in which the number of processes for manufacturing a monitor PD, and the manufacturing cost of the monitor PD, are reduced.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

A semiconductor laser device of the present invention is provided with: a supporting substrate, on the surface of which there is formed a wiring pattern; a LD that is fixed on the surface of the supporting substrate and that has a signal output section that emits signal laser light and a monitoring output section that emits monitoring laser light; and a monitoring PD.

The monitoring PD has: a semiconductor substrate having a region that transmits light of the wavelength of the monitoring laser light; and a light receiving section for photoelectric conversion formed on the surface of the semiconductor substrate, one incident surface of the side surfaces of the semiconductor substrate being arranged in a position to which the monitoring laser light can be made incident, the light receiving section being arranged in a position higher than the monitoring output section, and a back surface of the semiconductor substrate and the wiring pattern being fixed on the supporting substrate so as to oppose to each other.

According to the semiconductor laser device of the present invention, the LD and the monitor PD are arranged and fixed on the same supporting substrate 1 in such as way as to allow the monitoring laser light emitted from the LD to be incident from the incident surface of the monitor PD. Moreover, the semiconductor laser device is configured to allow this incident light to be incident on the light receiving section by reflecting it within the monitor PD. Accordingly, there are effects including the following (i) to (iii).

(i) Compared to a conventional semiconductor laser device that uses a large-sized subcarrier for monitoring, there is no need for avoiding a signal line. Therefore, in the case of high speed operation above 10 GHz, signal transmission can be achieved without impairing frequency characteristics.

(ii) Since special processing on the supporting substrate such as formation of a concave section does not need to be carried out as conventionally required, the supporting substrate can be manufactured inexpensively.

(iii) For example, a generic surface incident type PD may be used as the monitor PD. Furthermore, if the LD and the monitoring PD are installed so that the incident angle θ of the optic axis of the monitoring laser light incident on the incident surface falls within a range of 0°<θ<180°, the monitoring laser light incident on the incident surface of the PD can be prevented from returning by reflection, and the monitoring laser light can be efficiently converted into a monitoring signal. Also, there is no need for carrying out special processing on the monitor PD in order to prevent reflection of the monitoring laser light made incident on the incident surface. As a result, the number of processes for manufacturing the monitor PD, and the manufacturing cost of the monitor PD, can be reduced.

DESCRIPTION OF THE REFERENCE SYMBOLS

Figure 1:
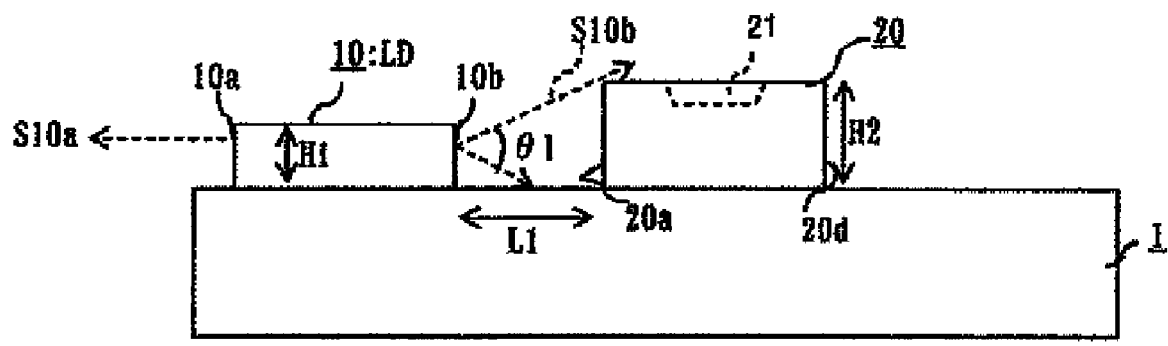
FIG. 1 is a schematic side view of a semiconductor laser device showing an embodiment 1 of the present invention.

1: Substrate
10: LD
10a, 10b: Emitting surface
20, 20A, 20B: Monitor PD
20a: Incident surface
20b, 20c: Side surface
20d: Back surface
21: Light receiving section
30, 30b, 30c, 32: Reflecting film
31: Anti-reflecting film

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

A semiconductor laser device has a LD and a surface incident type PD, these LD and surface incident type PD being arranged on a same supporting substrate, monitoring laser light emitted from a back surface of the LD being incident from one incident surface among side surfaces of the PD, and this incident light being incident on a light receiving section of the PD by reflecting the incident light inside the PD. That is to say, the monitoring laser light is directly incident on the light receiving section of the PD, and it is incident on the light receiving section utilizing the internal reflection of a light transmitting semiconductor substrate that constructs the PD.

Embodiment 1

Structure of the Embodiment 1

Figure 2:
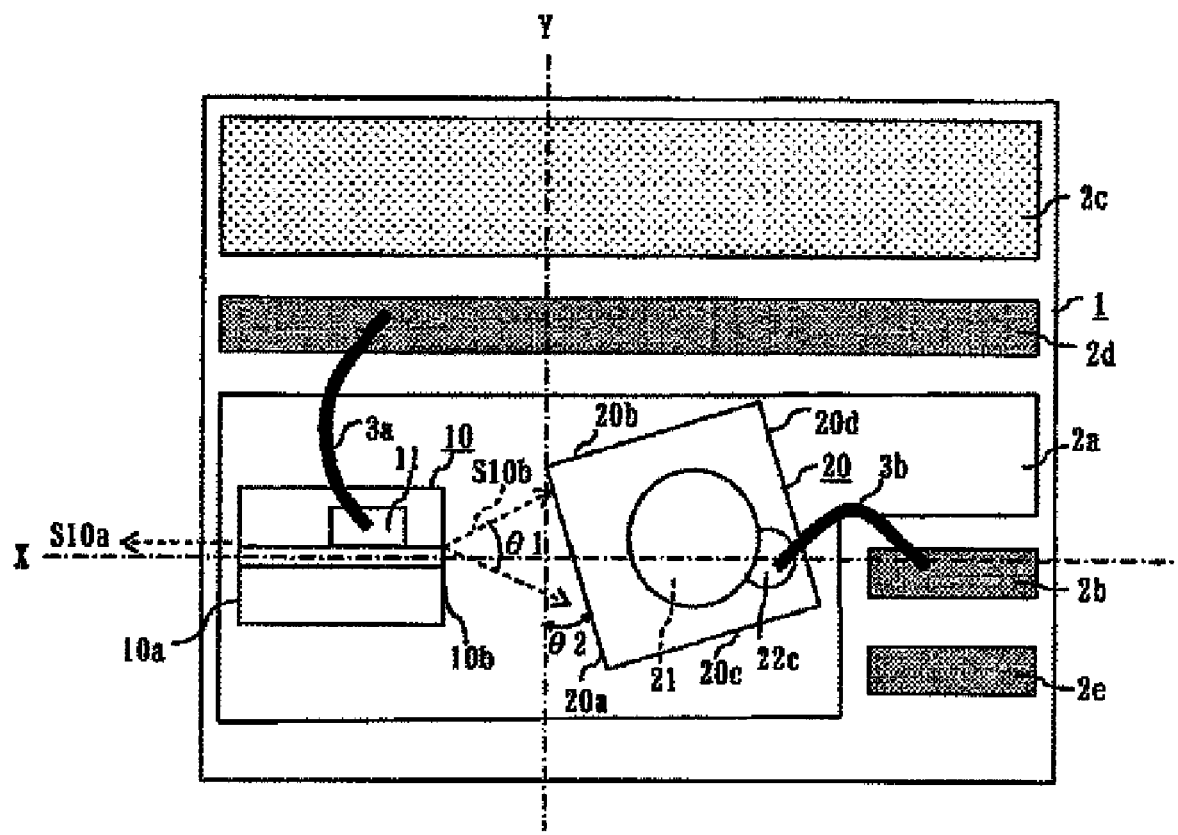
FIG. 2 is a schematic plan view of FIG. 1.

FIG. 1 is a schematic side view of a semiconductor laser device showing an embodiment 1 of the present invention, and FIG. 2 is a schematic plan view of FIG. 1.

This semiconductor laser device has a substantially orthogonal shaped supporting substrate (hereinafter, simply referred to as "substrate") 1, with a ceramic or glass made top surface that has no curves, and is practically flat. On the top surface of the substrate 1, there is formed a die bonding wiring pattern (for example, a metallic pattern) 2a for fixing elements along the X axis of the lengthwise direction, and furthermore, in the proximity of the wiring pattern 2a, there are formed wire bonding wiring patterns (for example, metallic pattern) 2b, 2d, and 2e for wire-connecting the elements, and a ground (GND) wiring pattern (for example, metallic pattern) 2c. On the die bonding metallic pattern 2a, a LD 10 is dice-bonded (fixed) by soldering, for example, on the left side (front side) along the X axis, and in a position on the right side (rear side) of this LD 10, distanced from the LD 10 by a predetermined distance L1, a surface incident type monitor PD 20 is dice-bonded by soldering. The predetermined distance L1 is set to a value at which a light receiving amount (for example, light receiving electric current) of the PD 20 is maximized (for example, approximately 200 μm).

The LD 10 is a substantially rectangular solid chip, a height H1 thereof being approximately 100 μm and made up from a InGaAsP (active layer)/InP (substrate) of an approximate wavelength a 1.3 μm to 1.55 μm for example. On its plan surface (top surface), there is provided an electrode 11 for wire bonding, and from an emitting surface 10a on a left side surface (front surface) on the X axis, a signal laser light S10a is emitted to the left direction (forward), and from an emitting surface 10b of a right side surface (back surface), a monitoring laser light S10b (spread angle θ1 in the light axis direction is several tens of degrees) is emitted to the right direction (rearward). The electrode 11 of the LD 10 is connected to the metallic pattern 2d by a metallic wire 3a.

The surface incident type monitor PD 20 is a chip, a height H2 thereof being approximately 200 μm and made up from a pin photodiode that uses an InP substrate of a band gap 1.35 eV and an approximate wavelength 0.9 μm for example. In the upper region within the PD 20, there is formed a light receiving section 21 for light/electricity conversion, and on the plan surface (upper surface) of the PD 20, there is provided a metallic (Au or the like) anode electrode 22 for wire bonding. The anode electrode 22 is connected to the metallic pattern 2b by a metallic wire 3b. The monitor PD 20 is constructed so that the left side surface (front surface) thereof, which opposes the back surface of the LD 10, is an incident surface 20a that receives the monitoring laser light S10b, whereupon, from this surface 20a, the incident laser light S10b either travels through the interior to arrive directly at the light receiving section 21, or reflects from the side surfaces 20b, 20c and 20d to arrive at the light receiving section 21, and is converted to a signal (for example an electric current). The incident surface 20a is arranged so as to incline at an arbitrary angle $\theta 2$ (where $0°<\theta 2<180°$) based on the Y axis, which is orthogonal to the X axis, to prevent the incident laser light S10b from being reflected and returned.

Figure 3:
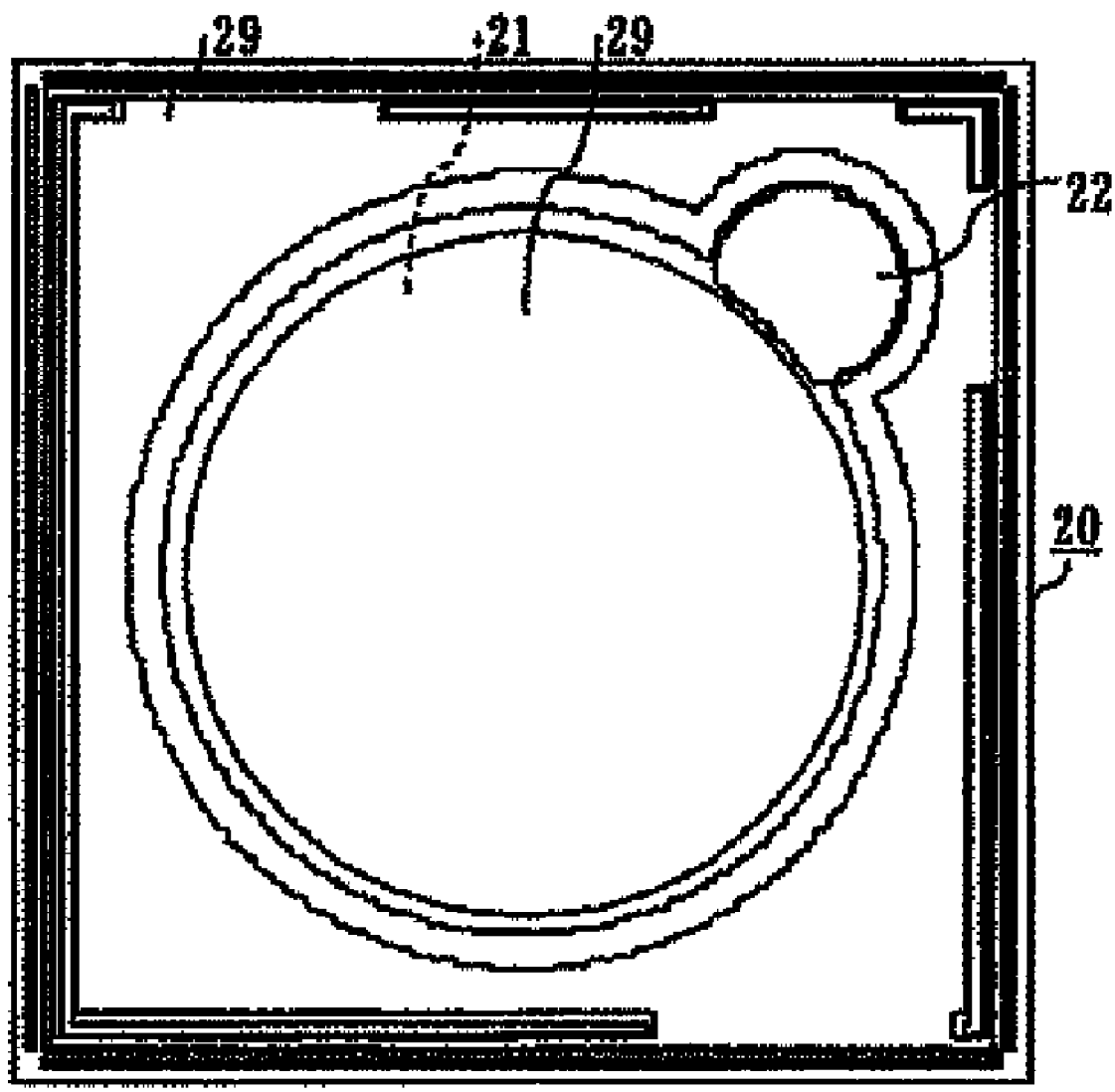
FIG. 3 is a schematic plan view of a monitor PD of FIG. 1 seen from above.
Figure 4:
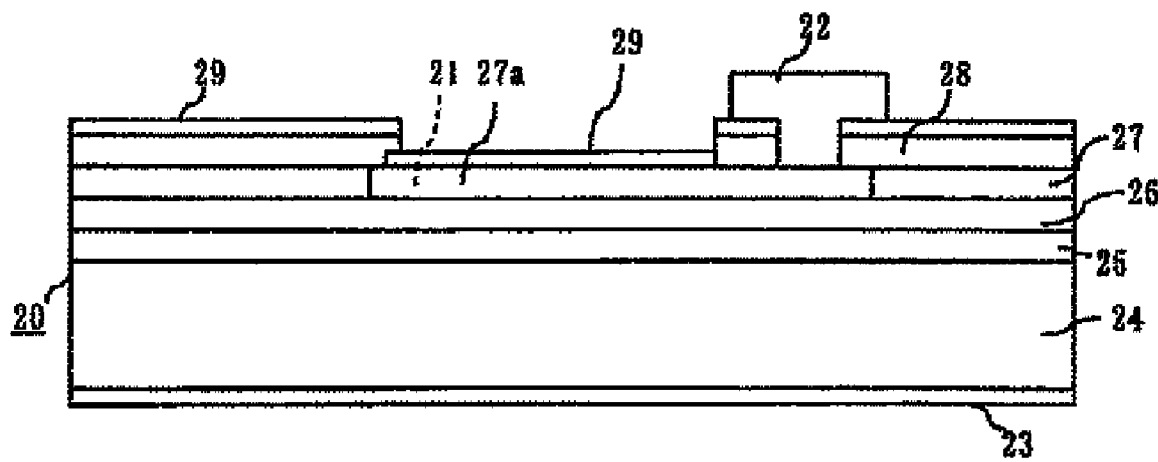
FIG. 4 is a schematic longitudinal sectional view of the monitor PD of FIG. 1.

FIG. 3 is a schematic plan view of the surface incident type monitor PD 20 of FIG. 1 seen from above, and FIG. 4 is a schematic longitudinal sectional view of the surface incident type monitor PD 20 of FIG. 1.

This surface incident type monitor PD 20 is constructed with a generic pin photodiode, the plan surface (top surface) of which receives light for example. Its sectional structure has, laminated, from the bottom layer to the top layer, a cathode electrode 23 made from metal such as gold, an indium-phosphorous substrate (n⁻InP substrate) 24, an indium-phosphorous layer (n⁻InP layer) 25, an n⁻ type indium-gallium-arsenic layer (n⁻InGaAs layer) 26 as an absorption layer, and an n⁻InP layer 27. A P⁺diffusion region 27a made from zinc (Zn) is formed in a light receiving portion in this n⁻InP layer 27, and the n⁻InGaAs layer 26 and the P⁺diffusion region 27a construct the light receiving section 21. Furthermore, on the n⁻InP layer 27 there is formed an insulating film 28 such as a silicon nitride film (Si2N4 film), and the center of this insulating film 28 is opened for receiving light, and on the entire surface of the insulating film 28 including this opening portion there is formed an anti-reflection film (AR film) 29 such as silicon nitride film (SiNx). On the anti-reflection film 29 adjacent to the opening portion there is formed an anode electrode 22, and this anode electrode 22 is electrically connected to the P⁺diffusion region 27a through a via hole (conductive hole).

Apart from the upper and lower electrodes 22 and 23 and the n⁻InGaAs layer 26, which is an absorption layer, the n⁻InP substrate 24, the n⁻InP layer 25, the n⁻InP layer 27, the P⁺diffusion region 27a, the insulating film 28, and the anti-reflection film 29 are formed from transparent materials.

An aspect of the present embodiment 1 is that instead of having the laser light S10b directly incident on the light receiving section 21 from above as is conventionally done, the laser light S10b is incident on the incident surface 20a of the side surfaces of the monitor PD 20, wherefrom, this laser light S10b is internally reflected utilizing internal reflection on the n⁻InP substrate 24 to be made incident on the light receiving section 21.

Operation of the Embodiment 1

Figure 5:
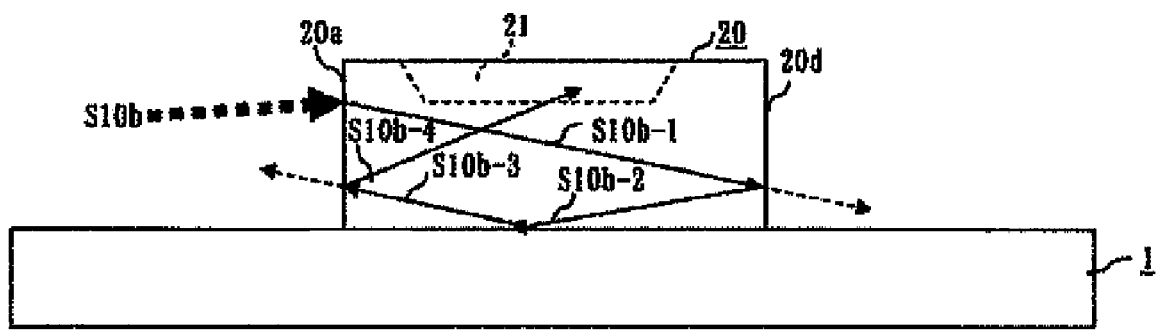
FIG. 5 is a schematic sectional view showing a light transmission path in the monitor PD of FIG. 1.
Figure 6:
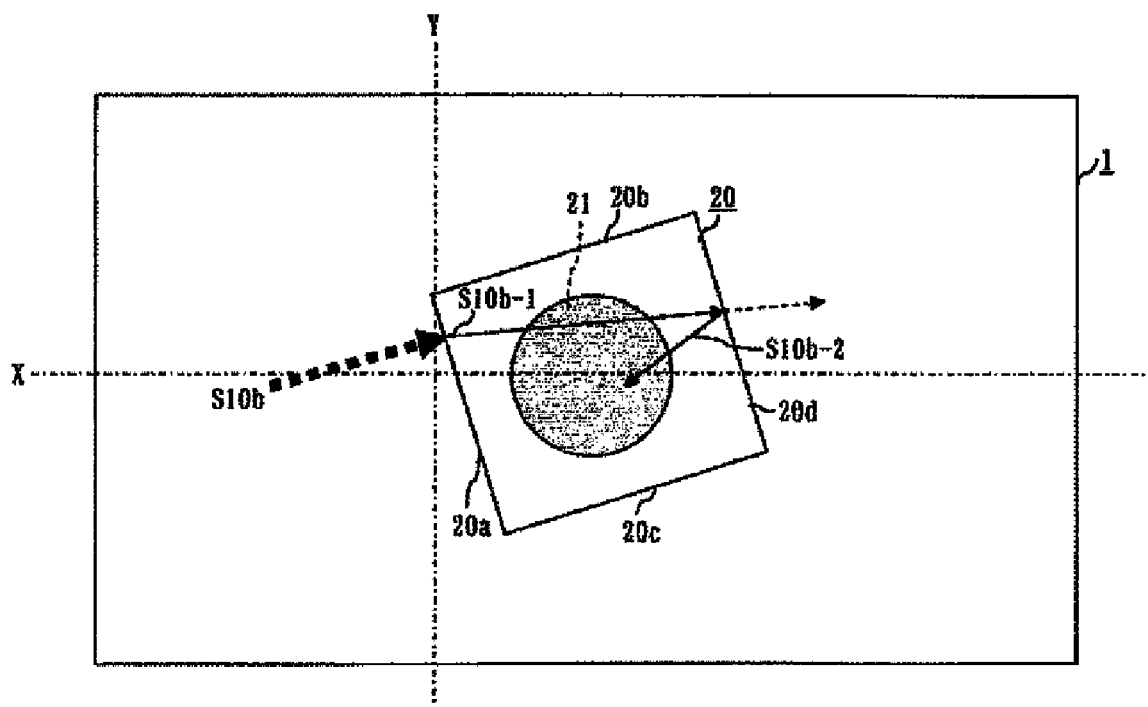
FIG. 6 is a schematic plan view showing a light transmission path in the monitor PD of FIG. 1.

FIG. 5 is a schematic sectional view showing a light transmission path in the monitor PD 20 of FIG. 1, and FIG. 6 is a schematic plan view showing a light transmission path in the monitor PD 20 of FIG. 1. The operation of the semiconductor laser device of FIG. 1 is now described, making reference to FIG. 5 and FIG. 6.

When electric power is supplied from the metallic patterns 2b, 2d to the LD 10 and the monitor PD 20 via the wires 3a and 3b, a signal laser light S10a is emitted in the forward direction of the X axis from the emitting surface 10a of the LD 10, and the monitoring laser light S10b is emitted in the rearward direction of the X axis from the emitting surface 10b. The monitoring laser light S10b is irradiated on the incident surface 20a of the monitor PD 20, then diffused inside this monitor PD 20, before reaching the light receiving section 21 to be converted into electric current.

That is to say, since the monitor PD 20 is constructed from a light transmitting semiconductor substrate (for example, the n⁻InP substrate 24), of the monitoring laser light S10b that is emitted from the LD 10, that which reaches the incident surface 20a of the monitor PD 20 is transmitted into the inside of the monitor PD 20 (incident light S10b-1), a portion thereof being directly incident on the light receiving section 21 to be converted into electric current, and the other portion of the laser light being repeatedly reflected within the monitor PD 20. For example, part of the incident light S10b-1 is reflected on a back surface 20d and becomes reflected light S10b-2, this reflected light S10b-2 is reflected off the electrode 23 on the bottom surface, a portion of the reflected light S10b-3 thereof is again reflected off the incident surface 20a, and the reflected light S10b-4 thereof reaches the light receiving section 21 to be converted into electric current.

Effects of the Embodiment 1

According to the present embodiment 1, as a result of adopting a configuration in which the LD 10 and the monitor PD 20 are arranged and fixed on the same substrate 1, and the monitoring laser light S10b emitted from the LD 10 is incident on the incident surface 20a of the monitor PD 20, wherefrom the incident light S10b-1 is reflected within the monitor PD 20 to be made incident on the light receiving section 21, the following effects (a) to (c) are achieved.

(a) Compared to a conventional semiconductor laser device that uses a large-sized subcarrier for monitoring, there is no need for avoiding a signal line. Therefore, in the case of high speed operation above 10 GHz, signal transmission can be achieved without impairing frequency characteristics.

(b) Since special processing, such as formation of a concave section, does not need to be carried out on the substrate 1 as conventionally required, the substrate 1 can be manufactured inexpensively.

(c) Since a monitor having a generic pin photodiode structure for example is used as the monitor PD 20 and installed so that the incident surface 20a is inclined at an angle $\theta 2$ to the Y axis, an incident laser light S20b can be prevented from being reflected and returned, and the laser light S10b can be efficiently converted into monitoring electric current. Also, the monitor PD 20 does not require special processing to prevent reflection of the laser light S20b made to be incident. As a result, manufacturing processes in manufacturing the monitor PD 20 can be reduced while reducing the cost in manufacturing.

Embodiment 2

Structure of the Embodiment 2

Figure 7:
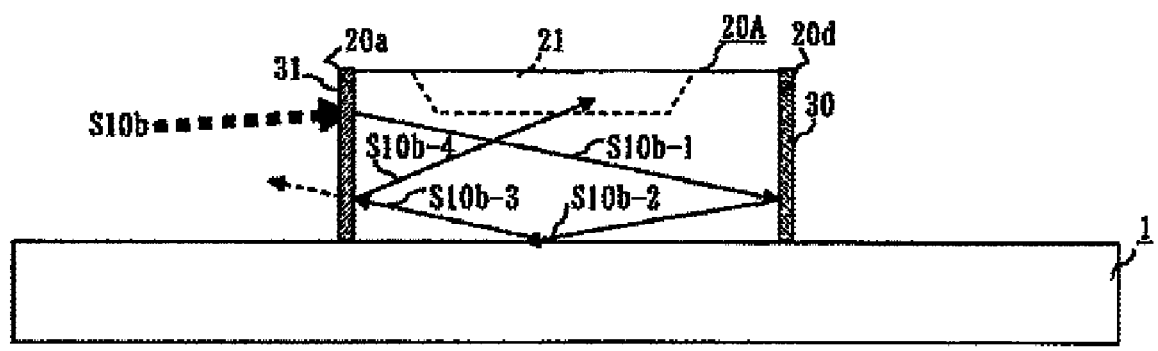
FIG. 7 is a schematic sectional view of the proximity of a monitor PD showing an embodiment 2 of the present invention.
Figure 8:
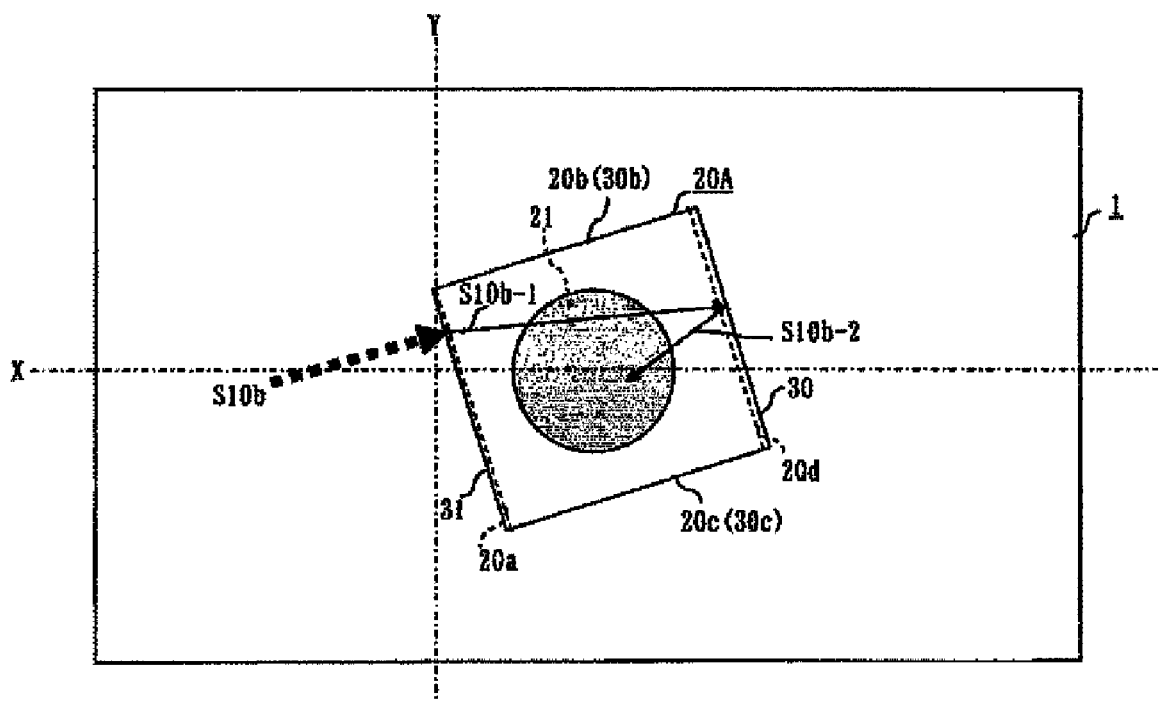
FIG. 8 is a schematic plan view of the proximity of the monitor PD shown in FIG. 7.

FIG. 7 is a schematic sectional view of the proximity of a monitor PD showing an embodiment 2 of the present invention, and FIG. 8 is a schematic plan view of the proximity of the monitor PD shown in FIG. 7. These FIG. 7 and FIG. 8 are drawings that correspond to FIG. 5 and FIG. 6 in the embodiment 1, and the same reference symbols are given to the common components in FIG. 5 and FIG. 6.

In a monitor PD 20A of the present embodiment 2, as a PD example 1, a reflection film (HR film) is adhered on the back surface 20d of the monitor PD 20A. For example, a metallic film such as aluminum (Al) film or a dielectric reflection film of reflectivity over 90% may be used as a reflection film 30.

As a PD example 2, in addition to the PD example 1, an anti-reflection film (AR film) 31 is adhered on the incident surface 20a of the monitor PD 20A. As the anti-reflection film 31, for example, a transparent film such as SiNx can be used, and the reflectance thereof is less than a few percent depending on the formation materials for the film and the film thickness.

As a PD example 3, in addition to the PD example 2, an anti-reflection film made from a metallic film or dielectric reflection film is also adhered on both of the side surfaces 20b and 20c of the monitor PD 20A. To clarify the description, reference symbol 30b is given to a reflection film of the side surface 20b and reference symbol 30c is given to a reflection film of the side surface 20c.

Operation and Effects of the Embodiment 2

(1) In the Case of the PD Example 1

In the PD example 1, since the reflection film 30 is formed on the back surface 20d of the monitor PD 20A, when the monitoring laser light S10b emitted from the LD 10 is made incident on the incident surface 20a of the monitor PD 20A, this laser light S10b is transmitted into the inside (incident light S10b-1), and a portion of this incident light S10b-1 is almost entirely reflected off the reflection film 30 of the back surface 20d and becomes reflected light S10b-2. Then this reflected light S10b-2 is reflected off the electrode 23 on the bottom surface, a portion of the reflected light S10b-3 thereof is reflected again off the incident surface 20a, and the reflected light S10b-4 thereof reaches the light receiving section 21 to be converted into electric current.

As described above, since substantially all of the incident light S10b-1 is reflected by the reflection film 30, an amount of the reflected light S10b-4 that reaches the light receiving section 21 increases, and an amount of monitoring electric current that is converted in the light receiving section 21 also increases. In the result of an experiment carried out by the present inventor, it has been confirmed that in the case of the embodiment 1 where the reflection film 30 is not formed, approximately 25% of the light of the emitted monitoring laser light S10b can be converted into monitoring electric current, and therefore, in the case of forming the reflection film 30 as described in the present PD example 1, 25% or more of the light can be converted into monitoring electric current.

(2) In the Case of the PD Example 2

In the PD example 2, since the reflection film 30 is formed on the back surface 20d of the monitor PD 20A and the anti-reflection film 31 is formed on the incident surface 20a, when the monitoring laser light S10b emitted from the LD 10 is made incident on the incident surface 20a, the anti-reflection film 31 prevents the laser light S10b from being reflected and returned, and the laser light S10b can be efficiently introduced into the monitor PD 20A, so that the optical power of the incident laser light increases.

The anti-reflection film 31 has an effect such that the light that has once been transmitted into the monitor PD 20A is repeatedly reflected within the monitor PD 20A and its internal reflection is reduced by the time the light has reached the incident surface 20a again, leading to a reduction in light reception current. On the other hand, in the case of not forming the anti-reflection film 31 on the incident surface 20a, the monitoring laser light S10b that is incident into the monitor PD 20A decreases but its internal reflection increases.

According to the result of an experiment carried out by the present inventor, it has been confirmed that in the case where the anti-reflection film 31 was not formed, approximately 30% of the monitoring laser light S10b can be converted into monitoring electric current. On the other hand, in the case where the anti-reflection film 31 is formed, a result in which approximately 35% light of the monitoring laser light S10b could be converted into monitoring electric current was achieved.

(2) In the Case of the PD Example 3

In the PD example 3, since respectively, the reflection film 30 is formed on the back surface 20d of the monitor PD 20A, the anti-reflection film 31 is formed on the incident surface 20a, and the reflection films 30b and 30c are formed on both of the side surfaces 20b and 20c, the incident light S10b-1 that is incident on the monitor PD 20A can be efficiently reflected on the reflection films 30, 30b, and 30c, so that internal reflection increases, and 50% or more light of the monitoring laser light S10b can be converted into monitoring electric current.

Embodiment 3

Structure of the Embodiment 3

Figure 9:
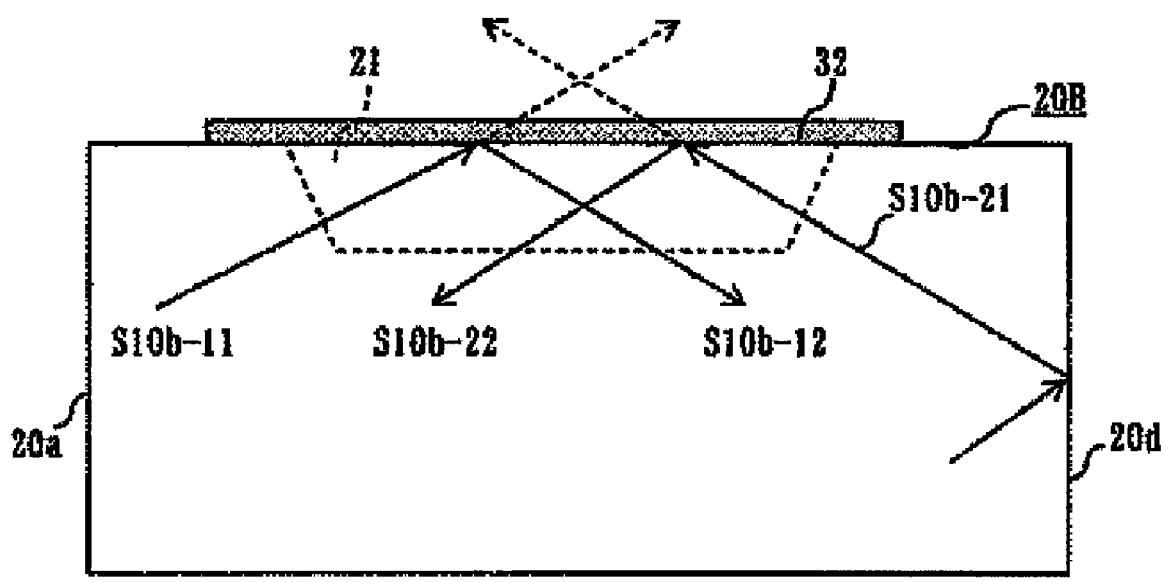
FIG. 9 is a schematic sectional view of a monitor PD showing an embodiment 3 of the present invention.

FIG. 9 is a schematic sectional view of a monitor PD showing an embodiment 3 of the present invention. Common reference symbols are given to the components that are common with those of FIG. 1 to FIG. 6 that show the embodiment 1.

In a monitor PD 20B of the present embodiment 3, on the surface of the light receiving section 21 there is formed a reflection film 32. For example, a metallic luster film made from Au or a dielectric reflection film (½ wavelength monolayer dielectric reflection film, ½ wavelength multilayer dielectric reflection film) may be used as the reflection film 32, and the reflectivity thereof is 90% or more. Other configurations of the present embodiment are similar to that of the embodiment 1.

Operation of the Embodiment 3

When the monitoring laser light S10b emitted from the LD 10 shown in FIG. 1 is made incident on the incident surface 20a of the monitor PD 20B, this laser light S10b is transmitted into the interior (incident lights S10b-11 and S10b-21), and these incident lights S10b-11 are S10b-21 are made incident on the light receiving section 21. A portion of the incident lights S10b-11 and S10b-21 that are made incident on the light receiving section 21 is transmitted without being absorbed by the n-InGaAs layer 26, which is an absorption layer within the light receiving section 21 shown in FIG. 4. The generic PD 20 for monitoring shown in FIG. 4 has the anti-reflection film 29 formed on the top surface of the light receiving section 21, so the transmitted light is merely discharged into free space and is wasted.

However, in the present embodiment 3, since the reflection film 32 is formed on the anti-reflection film 29, a portion of the incident lights S10b-11 and S10b-21 that is not absorbed by the light receiving section 21 is reflected and returned. These returned reflected lights S10b-12 and S10b-22 again pass through the light receiving section 21 and are absorbed. As a result, the light absorption efficiency (light receiving efficiency) in the light receiving section 21 is improved, and the laser light S10b can be efficiently converted into monitoring electric current.

Effects of the Embodiment 3

According to the present embodiment 3, since the reflection film 32 is formed on the light receiving section 21, in substantially the same way as in the embodiment 1, light reception sensitivity is improved and the laser light S10b can be efficiently converted into a monitoring electric current. Moreover, if the reflection film 32 of the present embodiment 3 is applied to the examples 1 and 2, the laser light S10b can be more efficiently converted into monitoring electric current, compared to these examples 1 and 2.

Modified Example

The present invention is not limited to the above embodiments 1 to 3, and various forms of application and modifications are possible. For example, (a) and (b) below are examples of such forms of application and modifications.

(a) Shapes, structures, forming materials and so forth of the LD 10 and the monitor PD 20, 20A, and 20B may be changed to ones that are not shown in the drawings.

(b) In the embodiments, an example of an application of the present invention to the semiconductor laser device that uses the generic LD 10 has been described. However, the present invention is also applicable to an LD 10 and a laser module having an electro-absorption modulator that modulates the signal laser light S10a emitted from this LD 10.

What is claimed is:

1. A semiconductor laser device comprising:
   a supporting substrate having a wiring pattern on a surface thereof;
   a semiconductor laser element fixed on the surface of said supporting substrate, the semiconductor laser element having a signal output section at a first surface that emits signal laser light and a monitoring output section at a second surface that emits monitoring laser light; and
   a monitoring photodiode fixed on said supporting substrate,
   wherein said monitoring photodiode has a semiconductor substrate transparent to a wavelength of said monitoring laser light, and a light receiving section for photoelectric conversion on a surface of said semiconductor substrate,
   said monitoring photodiode having a side surface that is an exterior incident surface of said semiconductor substrate and that is arranged at a position so that said monitoring laser light is incident thereon, said light receiving section is arranged at a position higher than said monitoring output section, and a back surface of said semiconductor substrate opposite said exterior incident surface is arranged to oppose said wiring pattern,
   the surface of said supporting substrate is substantially a flat plane, and said semiconductor laser element and said monitoring photodiode are arranged on said flat plane with both the second surface and the exterior incident surface extending in a perpendicular direction from the flat plane, and
   the second surface and the exterior incident surface are arranged to be non-parallel with respect to each other.

2. A semiconductor laser device according to claim 1, wherein said semiconductor laser element and said light receiving section of said monitoring photodiode are electrically connected respectively to said wiring pattern via wires.

3. A semiconductor laser device according to claim 1, wherein a distance between said monitoring output section of said semiconductor laser element and said exterior incident surface of said monitoring photodiode is set so that a light reception amount of said monitoring photodiode is a maximum value.

4. A semiconductor laser device according to claim 1, wherein on the back surface of said semiconductor substrate there is an electrode that reflects, into said semiconductor substrate, said monitoring laser light that is incident into said semiconductor substrate at said exterior incident surface.

5. A semiconductor laser device according to claim 1, wherein on the back surface on a side opposite to the exterior incident surface of said semiconductor substrate there is a reflection film that reflects, into said semiconductor substrate, said monitoring laser light that is incident into the semiconductor substrate from said exterior incident surface.

6. A semiconductor laser device according to claim 1, wherein on said exterior incident surface of said semiconductor substrate there is an anti-reflection film that prevents reflection of said monitoring laser light that is incident on said exterior incident surface.

7. A semiconductor laser device according to claim 1, wherein on both side surfaces substantially orthogonal to said exterior incident surface of said semiconductor substrate there are reflection films that reflect, into said semiconductor substrate, said monitoring laser light that is incident into said semiconductor substrate from said exterior incident surface.

8. A semiconductor laser device according to claim 1, wherein on the light receiving section of said monitoring photodiode there is a reflection film that reflects, into said light receiving section, said monitoring laser light that is incident on said semiconductor substrate and transmitted through said light receiving section.

9. A semiconductor laser device according to claim 1, wherein said monitoring photodiode has a surface incident type structure.

10. A semiconductor laser device according to claim 5, wherein said reflection film is either a metallic film or a dielectric reflection film.

11. A semiconductor laser device according to claim 6, wherein said anti-reflection film is a silicon nitride film.

12. A semiconductor laser device according to claim 1, wherein said semiconductor substrate is an indium-phosphorous substrate.

13. A semiconductor laser device according to claim 1, wherein an angle of inclination θ of the exterior incident surface with respect to the second surface is $0° < θ < 180°$.

14. A semiconductor laser device according to claim 1, wherein an angle of inclination θ of the exterior incident surface with respect to the second surface is $0° < θ < 90°$.

* * * * *